(12) United States Patent
Iisaka

(10) Patent No.: US 10,261,802 B2
(45) Date of Patent: Apr. 16, 2019

(54) MANAGEMENT SYSTEM AND MANAGEMENT METHOD FOR COMPONENT MOUNTING LINE

(71) Applicant: FUJI CORPORATION, Chiryu-shi (JP)

(72) Inventor: Jun Iisaka, Nisshin (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/550,064

(22) PCT Filed: Feb. 13, 2015

(86) PCT No.: PCT/JP2015/054019
§ 371 (c)(1),
(2) Date: Aug. 10, 2017

(87) PCT Pub. No.: WO2016/129116
PCT Pub. Date: Aug. 18, 2016

(65) Prior Publication Data
US 2018/0011717 A1 Jan. 11, 2018

(51) Int. Cl.
*G06F 9/00* (2006.01)
*G06F 9/44* (2018.01)
(Continued)

(52) U.S. Cl.
CPC ........ *G06F 9/4411* (2013.01); *G05B 19/4183* (2013.01); *G05B 19/41855* (2013.01);
(Continued)

(58) Field of Classification Search
None
See application file for complete search history.

(56) References Cited

U.S. PATENT DOCUMENTS 6,535,786 B1  3/2003  Duemler
7,263,597 B2 *  8/2007  Everdell ................. H04L 47/10
709/201
(Continued)

FOREIGN PATENT DOCUMENTS

JP  2005-276116 A  10/2005
JP  2009-105107 A  5/2009

OTHER PUBLICATIONS

International Search Report dated May 19, 2015, in PCT/US2015/054019, filed Feb. 13, 2015.
(Continued)

*Primary Examiner* — Michael Sun
(74) *Attorney, Agent, or Firm* — Oblon, McClelland, Maier & Neustadt, L.L.P.

(57) ABSTRACT

A CPU box of each mounting machine module obtains MAC addresses of communication devices of both an internal device and a base by communicating with the communication devices of both the internal device and the base after the power is turned on, compares the obtained MAC address of the internal device side and the obtained MAC address of the base side, with storage data of the MAC addresses of both the internal device side and the base side read from a non-volatile storage medium of the CPU box, obtains management data of the mounting machine module stored in association with the MAC address of the internal device side from the non-volatile storage medium of a management computer in a case where the MAC address of the internal device side does not match the storage data, and obtains the management data of the mounting machine module stored in association with the MAC address of the base side from the non-volatile storage medium of the management computer in a case where the MAC address of the base side does not match the storage data.

9 Claims, 3 Drawing Sheets

(51) Int. Cl.
*G06F 9/4401* (2018.01)
*G05B 19/418* (2006.01)
*H04L 29/12* (2006.01)
*H05K 13/04* (2006.01)
*H05K 13/08* (2006.01)

(52) U.S. Cl.
CPC ......... *H04L 61/6022* (2013.01); *H05K 13/04* (2013.01); *H05K 13/0882* (2018.08); *Y02P 90/02* (2015.11); *Y02P 90/04* (2015.11); *Y02P 90/10* (2015.11)

(56) References Cited

U.S. PATENT DOCUMENTS

| | | | | |
|---|---|---|---|---|
| 2002/0165961 | A1* | 11/2002 | Everdell | H04L 41/22 709/225 |
| 2004/0010325 | A1 | 1/2004 | Naitoh | |
| 2010/0036931 | A1* | 2/2010 | Certain | G06F 11/1451 709/214 |
| 2014/0297342 | A1* | 10/2014 | Ogata | G06F 17/30604 705/7.11 |
| 2014/0331086 | A1* | 11/2014 | Resch | G06F 11/1458 714/15 |
| 2017/0085637 | A1* | 3/2017 | Cencini | H04L 67/1042 |
| 2017/0168472 | A1* | 6/2017 | Ando | G05B 19/042 |

OTHER PUBLICATIONS

European Search Report dated Oct. 8, 2018 for European Patent Application No. 15881990.4-1217.

\* cited by examiner

MANAGEMENT SYSTEM AND MANAGEMENT METHOD FOR COMPONENT MOUNTING LINE

TECHNICAL FIELD

The present disclosure relates to a management system and a management method for a component mounting line in which multiple devices that sequentially perform multiple processes for producing an electronic component mounting board on which an electronic component is mounted, are arranged along a conveyance path of the board.

BACKGROUND ART

As described in PTL 1 (JP-A-2009-105107), since multiple devices configuring a component mounting line are required to cooperate between devices to perform operation such as a board conveyance, an operator manually inputs a node number indicating an arrangement order of the multiple devices to a computer managing the component mounting line or to each device, and generates equipment arrangement information indicating the arrangement order of the devices. However, when the operator manually inputs the node number, since there is a possibility that the node number will be erroneously input due to human error, in the invention described in PTL 1, a function for automatically generating the equipment arrangement information indicating the arrangement order of each device is provided.

CITATION LIST

Patent Literature

PTL 1: JP-A-2009-105107

SUMMARY

However, in the invention described in PTL 1, although it is possible to cope with exchange of a device configuring a component mounting line, automatic identification cannot be performed in a case where a communication device of an internal device such as a CPU box, a conveyor, or an XY robot inside the device is replaced without exchanging the device. In these cases, it is troublesome for an operator to perform an operation for updating management data of a device stored in a storage medium of the CPU box in the device.

An object of the present disclosure is to provide a management system and a management method for a component mounting line capable of automating much of a work for updating management data of a device stored in a storage medium of the CPU box, even when the CPU box, or a communication device of the internal device such as the conveyor or the XY robot, of the device configuring the component mounting line is replaced.

In order to solve the problem, there is provided a management system and a management method for a component mounting line in which multiple devices that perform multiple processes for producing an electronic component mounting board on which an electronic component is mounted in an order are disposed along a conveyance path of the electronic component mounting board, the management system including: a management computer that is connected to the multiple devices configuring the component mounting line through a communication network and manages the component mounting line, in which a CPU box as the control entity and an internal device communicating with the CPU box are attached to each device configuring the component mounting line, unique identification information assigned to a communication device of the internal device communicating with the CPU box is stored in a non-volatile storage medium of the CPU box of each device, and management data of each device is stored in the non-volatile storage medium of the management computer in association with the unique identification information of an internal device side of each device configuring the component mounting line, and the CPU box of each device communicates with the communication device of the internal device, obtains the unique identification information of the internal device side, compares the unique identification information of the internal device side with the storage data of the unique identification information of the internal device side read from the non-volatile storage medium of the CPU box, and, if both do not match each other based on the comparing, determines that the CPU box or the communication device of the internal device has been replaced, and obtains the management data of the device stored in association with the unique identification information of the internal device side from the non-volatile storage medium of the management computer.

In this configuration, the CPU box of each device configuring the component mounting line obtains the unique identification information of the internal device side by communication with a communication device of the internal device, compares the unique identification information of the internal device side with the storage data of the unique identification information of the internal device side read from the non-volatile storage medium of the CPU box, determines whether both match each other, and thus can automatically identify the CPU box or the communication device of the internal device has been replaced. Accordingly, in a case where the CPU box or the communication device of the internal device has been replaced, it is considered that it is necessary to reset the management data of a device corresponding to the internal device in the CPU box. Thus, in the present disclosure, in a case where it is determined that the CPU box or the communication device of the internal device has been replaced, the CPU box obtains the management data of the device stored in association with the unique identification information on the internal device side from the non-volatile storage medium of the management computer managing the component mounting line. Thus, in a case where the CPU box or the communication device of the internal device has been replaced, the CPU box can automatically obtain the management data of a device corresponding to the internal device. With this, in a case where the CPU box or the communication device of the internal device has been replaced, much of a work for updating the management data of the device stored in the non-volatile storage medium of the CPU box can be automated.

In this case, the unique identification information assigned to the internal device may use a media access control (MAC) address that is physically assigned to uniquely identify each communication entity on the communication network. Instead of the MAC address, any identification information may be used if the identification information can uniquely identify the communication entity.

In addition, the management data of each device stored in the non-volatile storage medium of the management computer may include at least one of a serial number of each device, calibration data, function setting data, and a disposition order.

In addition, when the management data of the device stored in association with the unique identification information of the internal device side is obtained from the non-volatile storage medium of the management computer, if the management data of the device associated with the unique identification information of the internal device side is not stored, the CPU box of each device may prompt an operator to input the management data of the device, and may store the management data of the device input by the operator in the non-volatile storage medium of the management computer in association with the unique identification information of the internal device side. In this manner, the management data of the device input by the operator can be used for subsequent data updates.

In addition, in a case where each of the devices is exchangeably placed on the base and configures the component mounting line and the communication device communicating with the CPU box of each device is provided for each device on the base, the unique identification information assigned to the communication device of the base communicating with the CPU box may be stored in the non-volatile storage medium of the CPU box of each device, the management data of each device may be stored in the non-volatile storage medium of the management computer in association with the unique identification information of the communication device of the base, and the CPU box of each device may communicate with the communication device of the base, obtain the unique identification information of the communication device of the base, compare the unique identification information of the communication device of the base with the storage data of the unique identification information of the communication device of the base read from the non-volatile storage medium of the CPU box, and, if both match do not match each other based on the comparing, determine that at least one of the device, the CPU box, and the communication device of the base has been replaced, and obtain the management data of the device stored in association with the unique identification information of the communication device of the base from the non-volatile storage medium of the management computer.

In this configuration, in a case where any one of the device on the base, the CPU box of each device, and the communication device of the base has been replaced, the CPU box can automatically identify the replacement and can automatically obtain the management data of the device placed on the base.

In addition, when loading of a boot-up image fails during booting of an operating system after power is turned on, the CPU box of each device may boot in a safe mode, obtain the boot-up image of the operating system from the management computer, and then reboot. In this manner, the CPU box of each device can automatically reboot even if the CPU box fails to boot.

Furthermore, when the boot-up image is successfully loaded during booting of the operating system after the power is turned on, the CPU box of each device may obtain information of a version of the operating system of the management computer from the management computer, and when the version of the booted operating system does not match the version of the operating system of the management computer, the CPU box may obtain the boot-up image of the operating system from the management computer, and then reboot. In this manner, when the version of the booted operating system does not match the version of the operating system of the management computer, the CPU box can reboot and automatically obtaining the boot-up image of the operating system from the management computer, and can automatically cause the version of the operating system used in the CPU box and the version of the operating system of the management computer to match each other.

DESCRIPTION OF EMBODIMENTS

Figure 1:
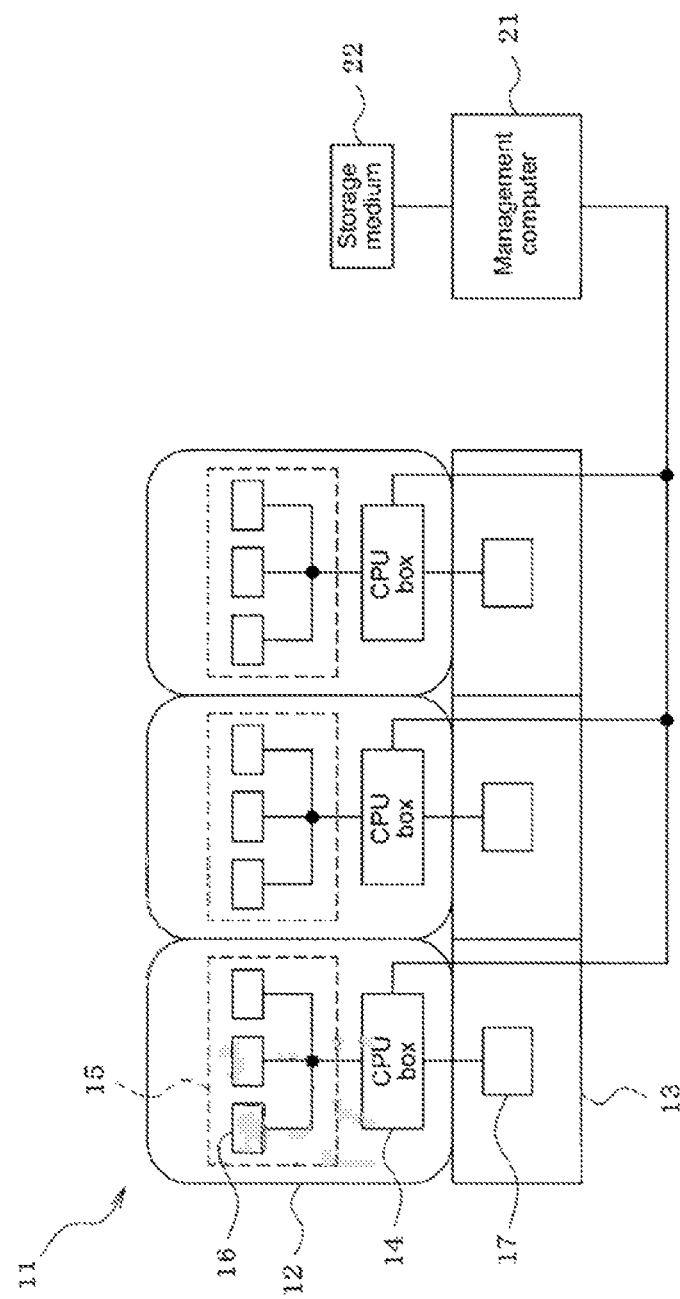
FIG. 1 is a block diagram showing a configuration of a component mounting line in an example of the present disclosure.

Hereinafter, an example of an embodiment of the present disclosure will be described. First, a configuration of component mounting line 11 will be described based on FIG. 1.

Component mounting line 11 is configured by arranging multiple mounting machine modules 12 (devices) and a mounting related device (not shown) sequentially performing multiple processes for producing an electronic component mounting board on which an electronic component is mounted according to a predetermined order, along a conveyance path of the board. Here, for example, the mounting related device is a device that performs a work of processes related to component mounting, such as a solder printer, an adhesive application device, a reflow device, and an inspection device.

Each of the mounting machine modules 12 is exchangeably placed on base 13. CPU box 14 as the control entity and communication device 16 of internal device 15 (for example, conveyor for conveying a board, XY robot for moving mounting head, remote I/O unit, or the like) are exchangeably mounted on each of the mounting machine modules 12. CPU box 14 and communication device 16 of internal device 15 are connected to each other through a communication network that communicates by using Ethernet (registered trademark). Although this is not shown, the CPU box and the communication device of the internal device are also exchangeably attached to the mounting related device, and the CPU box and the communication device of the internal device are connected to each other through a communication network that communicates by using Ethernet (registered trademark).

Meanwhile, communication device 17 that communicates with CPU box 14 of mounting machine module 12 on base 13 is also exchangeably attached to base 13. There are two types of mounting related devices, those that are mounted on the base and those that are not mounted on the base. In the mounting related device mounted on the base, the communication device that communicates with the CPU box of the mounting related device may be exchangeably attached to the base.

A MAC address (Media Access Control Address) which is unique identification information assigned to communication device 16 of internal device 15 communicating with CPU box 14 is stored in a rewritable non-volatile storage medium (SRAM, EEPROM, flash memory, or the like) of CPU box 14 of mounting machine module 12 placed on each of the bases 13. The MAC address is a 48-bit identification number physically allocated to uniquely identify each communication entity on the communication network and is also called as a physical address.

Furthermore, a MAC address, which is the unique identification information assigned to communication device 17 of base 13 of each mounting machine module 12, is stored in the rewritable non-volatile storage medium of CPU box 14 of each mounting machine module 12.

A MAC address, which is the unique identification information assigned to the communication device of the internal device communicating with the CPU box, is stored in the rewritable non-volatile storage medium of the CPU box of the mounting related device. Furthermore, in the mounting related device placed on the base, the MAC address assigned to the communication device of the base communicating with the CPU box is stored in the rewritable non-volatile storage medium of the CPU box of the mounting related device.

The multiple mounting machine modules 12 and the mounting related device configuring component mounting line 11 are connected to management computer 21 by the communication network, and component mounting line 11 is managed through management computer 21.

In rewritable non-volatile storage medium 22 such as a hard disk of management computer 21, management data of each mounting machine module 12 is stored in association with the MAC addresses of both the communication devices 16 and 17 of internal device 15 and base 13 of each mounting machine module 12 configuring component mounting line 11, and the management data of each mounting related device is also stored in association with the MAC addresses of the communication devices of both the internal device of the mounting related device and the base. In a case of the mounting related device having no base, the management data of each mounting related device may be stored in the non-volatile storage medium 22 of management computer 21 in association with only the MAC address of the communication device of the internal device of each mounting related device.

In this case, for example, the management data of mounting machine module 12 stored in the non-volatile storage medium 22 of management computer 21 in association with the MAC address of internal device 15 of each mounting machine module 12 is a serial number, calibration data, and function setting data of each mounting machine module 12. Meanwhile, for example, the management data of mounting machine module 12 stored in the non-volatile storage medium 22 of management computer 21 in association with the MAC address of communication device 17 of base 13 is an arrangement order of mounting machine modules 12.

CPU box 14 of each mounting machine module 12 executes a component mounting line management program of FIG. 2 and FIG. 3, which will be described below, after the power is turned on, communicates with communication device 16 of internal device 15 of each mounting machine module 12, obtains the MAC address of communication device 16 of internal device 15, communicates with communication device 17 of base 13 of each mounting machine module 12, and obtains the MAC address of communication device 17 of base 13. Accordingly, CPU box 14 of each mounting machine module 12 compares the obtained MAC address of the internal device 15 side and the obtained MAC address of a base 13 side, with storage data of the MAC address of the internal device 15 side and the MAC address of the base 13 side read from the non-volatile storage medium of CPU box 14, and determines whether the MAC addresses match the storage data. As a result, in a case where it is determined that the MAC address of the internal device 15 side does not match the storage data, it is determined that CPU box 14 or communication device 16 of internal device 15 has been replaced, and the management data of mounting machine module 12 stored in association with the MAC address of the internal device 15 side from the non-volatile storage medium 22 of management computer 21 is obtained. In addition, in a case where it is determined that the MAC address of the base 13 side does not match the storage data, CPU box 14 of each mounting machine module 12 determines that one of mounting machine module 12 and communication device 17 of CPU box 14 or base 13 has been replaced, and obtains the management data of mounting machine module 12 stored in association with the MAC address of the base 13 side from the non-volatile storage medium 22 of management computer 21.

When the management data of the mounting machine module 12 stored in association with the MAC address of the internal device 15 side is obtained from the non-volatile storage medium 22 of management computer 21, in a case where the management data of mounting machine module 12 associated with the MAC address of the internal device 15 side is not stored, CPU box 14 of each mounting machine module 12 prompts an operator to input the management data of mounting machine module 12 by using display or sound, and stores the management data of the mounting machine module 12 that is input by the operator, in the non-volatile storage medium of management computer 21 in association with the MAC address of the internal device 15 side.

Furthermore, when loading of a boot-up image (boot image) fails during booting of the operating system after power is turned on, CPU box 14 of each mounting machine module 12 boots in a safe mode, and reboots after obtaining the boot-up image of the operating system from management computer 21.

In addition, when the boot-up image is successfully loaded during booting the operating system after power is turned on, CPU box 14 of each mounting machine module 12 obtains information on the version of the operating system of management computer 21 from management computer 21, and when the version of the booted operating system does not match the version of the operating system of management computer 21, CPU box 14 is reboots after obtaining the boot-up image of the operating system from the management computer 21. Here, the boot-up image is an image file obtained by merging data and files required for booting into one image file. In addition, the safe mode is a diagnostic boot mode in which the operating system boots with only the minimum necessary drivers and only the minimum necessary functions, when a problem occurs during normal booting due to some trouble, or the like.

In addition, the CPU box of each mounting related device performs the same process as above after power is turned on, communicates with the communication device of the internal device of each mounting related device, and obtains the MAC address of the communication device of the internal device. In a case of the mounting related device placed on the base, the CPU box communicates with the communication device of the base of the mounting related device, and thus obtains the MAC address of the communication device of the base. Accordingly, the CPU box of each mounting related device compares the obtained MAC address of the internal device side and the obtained MAC address of the base side with the storage data of the MAC address of the internal device side and the MAC address of the base side read from the non-volatile storage medium of the CPU box, and determines whether the MAC addresses matches the storage data. As a result, in a case where it is determined that the MAC address of the internal device side does not match the storage data, the CPU box determines that the CPU box or the communication device of the internal device has been replaced, and obtains the management data of the mounting related device stored in association with the MAC address of the internal device from non-volatile storage medium 22 of management computer 21. In addition, in a case where it is determined that the MAC address of the base side does not match the storage data, the CPU box of the mounting related device placed on the base determines that one of the mounting related device, the CPU box, and the communication device of the base has been replaced, and obtains the management data of the mounting related device stored in association with the MAC address of the base side from non-volatile storage medium 22 of management computer 21.

When the management data of the mounting related device stored in association with the MAC address of the internal device side is obtained from non-volatile storage medium 22 of management computer 21, if the management data of the mounting related device associated with the MAC address of the internal device side is not stored, the CPU box of each mounting related device prompts an operator to input the management data of the mounting related device by using display or sound, and stores the management data of the mounting related device that is input by the operator, in the non-volatile storage medium of management computer 21 in association with the MAC address of the internal device side.

Furthermore, when the loading of the boot-up image fails during booting of the operating system after the power is turned on, through the same process as that of the CPU box 14 of the mounting machine module 12, the CPU box of each mounting related device boots in a safe mode, and reboots after obtaining the boot-up image of the operating system from management computer 21. In addition, when the boot-up image is successfully loaded during booting of the operating system after power is turned on, the CPU box of each mounting related device obtains the information on the version of the operating system of management computer 21 from management computer 21, and when the version of the booted operating system does not match the version of the operating system of management computer 21, the CPU box reboots after obtaining the boot-up image of the operating system from management computer 21.

Hereinafter, processing of component mounting line management programs of FIG. 2 and FIG. 3 executed by CPU box 14 of each mounting machine module 12 will be described. The component mounting line management programs of FIG. 2 and FIG. 3 are booted by power being turned on to CPU box 14, and thus the boot-up image is loaded in step 101. Then, processing proceeds to step 102, and it is determined whether the boot-up image has been successfully loaded. If it is determined that the loading of the boot-up image has failed, processing proceeds to step 103, and booting is performed in safe mode. Thus, in step 104, rebooting is performed after obtaining the boot-up image from management computer 21, and processing returns to the step 102.

In the above-described step 102, if it is determined that the boot-up image has been successfully loaded, processing proceeds to step 105, the MAC address of communication device 16 of internal device 15 is obtained by communicating with communication device 16 of internal device 15 of mounting machine module 12. Then, processing proceeds to step 106, and the MAC address of communication device 17 of base 13 is obtained by communicating with communication device 17 of base 13.

Figure 3:
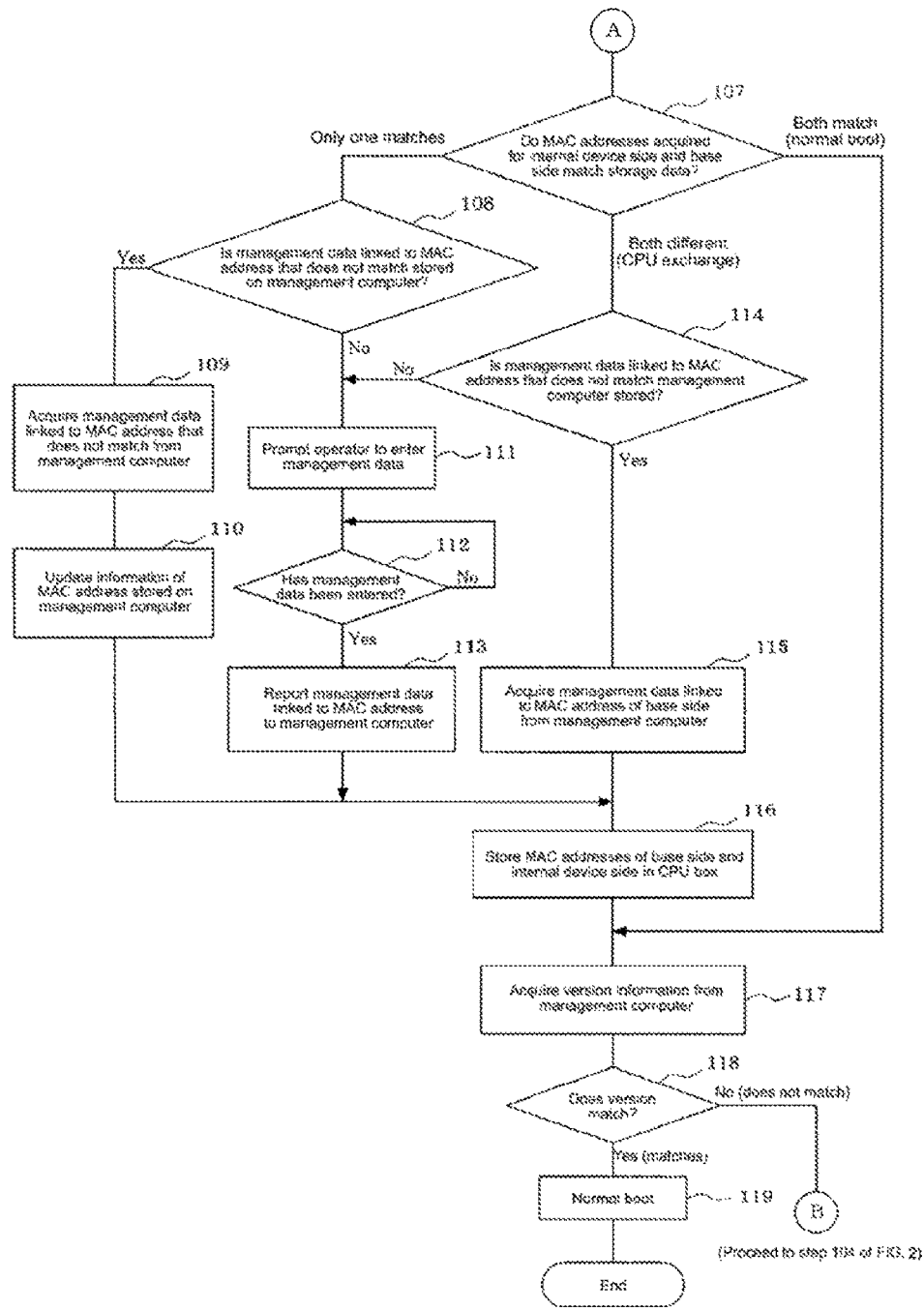
FIG. 3 is a flowchart (No. 2) showing a process flow of the component mounting line management program.

Then, processing proceeds to step 107 of FIG. 3, the obtained MAC address of the internal device 15 side and the obtained MAC address of the base 13 side are compared with the storage data of the MAC address of the internal device 15 side and the MAC address of the base 13 side read from the non-volatile storage medium of CPU box 14, and it is determined whether (1) both match, (2) only one matches, or (3) both are different.

(1) In a case where the MAC addresses of both the internal device 15 side and the base 13 side match the storage data of CPU box 14, it is determined that none of mounting machine module 12, CPU box 14, communication device 16 of internal device 15, and communication device 17 of base 13 has been replaced, and processing proceeds to step 117, which will be described below.

(2) In a case where only the MAC address of one of the internal device 15 side and the base 13 side matches the storage data of CPU box 14 (in a case where one MAC address is different), it is determined that one of mounting machine module 12, communication device 16 of internal device 15, and communication device 17 of base 13 has been replaced, and processing proceeds to step 108, which will be described below. In a case where mounting machine module 12 has been replaced, since the MAC address of the internal device 15 side of the mounting machine module 12 after replacement matches the storage data of CPU box 14 of mounting machine module 12, only the MAC address of the base 13 side does not match the storage data of CPU box 14 of mounting machine module 12.

(3) In a case where the MAC addresses of both the internal device 15 side and the base 13 side are different from the storage data of CPU box 14, it is determined that CPU box 14 has been replaced, and processing proceeds to step 114, which will be described below. Since the storage data of the MAC address stored in the CPU box 14 after replacement is different from the storage data of the MAC address stored in the CPU box 14 before replacement, in a case where the CPU box 14 has been replaced, the MAC addresses of both the internal device 15 side and the base 13 side do not match the storage data of CPU box 14.

In the above-described step 107, in a case where it is determined that only the MAC address of one of the internal device 15 side and the base 13 side matches the storage data of the CPU box 14 (in a case where one of mounting machine module 12, communication device 16 of internal device 15, and communication device 17 of base 13 has been replaced), processing proceeds to step 108, and it is determined whether the management data of the mounting machine module 12 associated with non-matching MAC address is stored in the non-volatile storage medium 22 of management computer 21. As a result, if it is determined that the management data of the mounting machine module 12 associated with the non-matching MAC address is stored, processing proceeds to step 109, and the management data of the mounting machine module 12 associated with the non-matching MAC address is obtained from the non-volatile storage medium 22 of management computer 21. Then, processing proceeds to step 110, the information of the MAC address stored in the non-volatile storage medium 22 of management computer 21 is updated into current information, and processing proceeds to step 116, which will be described below.

Meanwhile, in the above-described step 108, in a case where it is determined that the management data of the mounting machine module 12 associated with the non-matching MAC address is not stored in the non-volatile storage medium 22 of management computer 21, processing proceeds to step 111, and the operator is prompted to input the management data of the mounting machine module 12 via a display or sound from a display device (not shown). Then, processing proceeds to step 112, processing stands by until the management data of the mounting machine module 12 has been input, then processing proceeds to step 113 when the management data of the mounting machine module 12 has been input, and the management data of the mounting machine module 12 input by the operator to the management computer 21 in association with the non-matching MAC address is reported, the management data is stored in the non-volatile storage medium 22 of management computer 21, and processing proceeds to step 116, which will be described below.

In the above-described step 107, in a case where it is determined that the MAC addresses of both the internal device 15 side and the base 13 side are different from the storage data of CPU box 14, processing proceeds to step 114, and it is determined whether the management data of the mounting machine module 12 associated with the non-matching MAC address is stored in the non-volatile storage medium 22 of management computer 21. As a result, in a case where it is determined that the management data of the mounting machine module 12 associated with the non-matching MAC address is not stored in the non-volatile storage medium 22 of management computer 21, processing proceeds to step 111, the operator is prompted to input the management data of the mounting machine module 12 via display or sound from the display device (not shown), and when the management data of the mounting machine module 12 has been input, the management data of the mounting machine module 12 input by the operator is reported to the management computer 21 in association with the non-matching MAC address and thus stored in the non-volatile storage medium of the management computer 21 (step 112 and 113), and processing proceeds to step 116, which will be described below.

Meanwhile, in the above-described step 114, in a case where it is determined that the management data of the mounting machine module 12 associated with the non-matching MAC address is stored in the non-volatile storage medium 22 of the management computer 21, processing proceeds to step 115, and the management data of the mounting machine module 12 associated with the MAC address of the base 13 side is obtained from the non-volatile storage medium 22 of management computer 21.

Then, processing proceeds to step 116, the MAC addresses of both the current internal device 15 side and the current base 13 side are stored in the non-volatile storage medium of CPU box 14, and processing proceeds to step 117, which will be described below.

In the above-described step 107, in a case where it is determined that the MAC addresses of both the internal device 15 side and the base 13 side match the storage data of CPU box 14, processing directly proceeds to step 117.

In this step 117, the information on the version of the operating system of the management computer 21 is obtained from management computer 21, and CPU box 14 determines whether the version of the booted operating system matches the version of the operating system of management computer 21 in next step 118. As a result, in a case where it is determined that both versions match each other, processing proceeds to step 119 and booting is performed normally, and the program ends.

Figure 2:
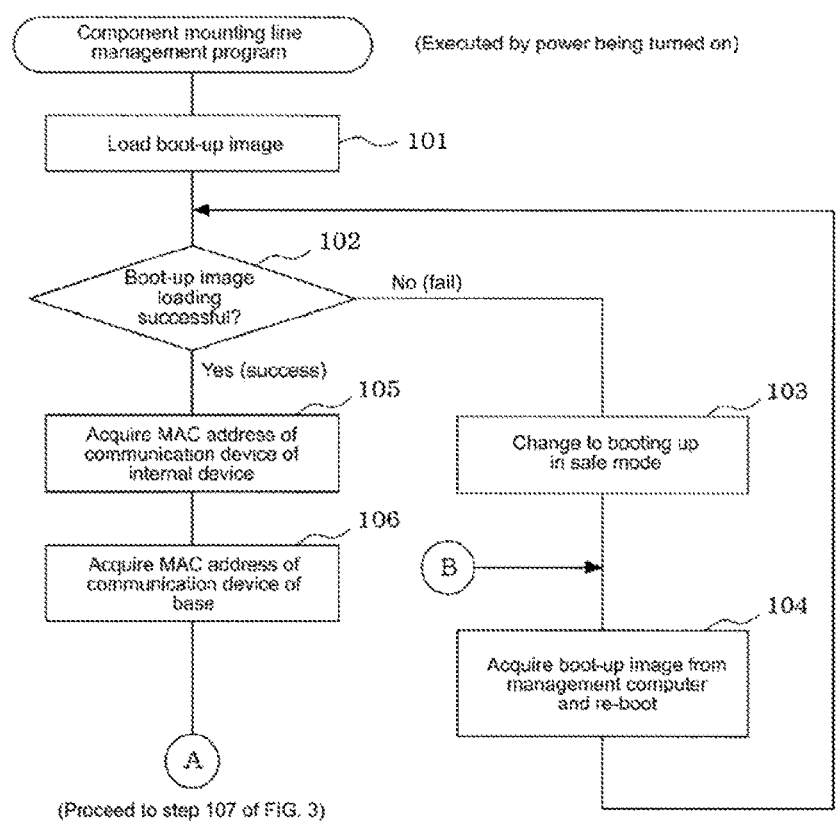
FIG. 2 is a flowchart (No. 1) showing a process flow of a component mounting line management program.

On the other hand, in the above-described step 118, in a case where it is determined that both versions do not match each other, in order that the versions match each other, processing proceeds to step 104 of FIG. 2 and rebooting is performed after obtaining the boot-up image of the operating system from management computer 21, and processing from step 102 is performed again.

According to the embodiment described above, the CPU box 14 of each mounting machine module 12 communicates with communication device 16 of internal device 15, obtains the MAC address of the internal device 15 side, compares the MAC address of the internal device 15 side with the storage data of the MAC address of the internal device 15 side read from the non-volatile storage medium of CPU box 14, determines whether the MAC address matches the storage data, and thus can automatically identify whether CPU box 14 or communication device 16 of internal device 15 have been replaced. Accordingly, in a case where CPU box 14 or communication device 16 of internal device 15 has been replaced, it is considered that it is necessary to reset the management data of mounting machine module 12 corresponding to internal device 15 in CPU box 14. Accordingly, in the embodiment, in a case where it is determined that CPU box 14 or communication device 16 of internal device 15 has been replaced, CPU box 14 obtains the management data of the mounting machine module 12 stored in association with the MAC address of the internal device 15 side from the non-volatile storage medium 22 of management computer 21 managing component mounting line 11. Thus, in a case where CPU box 14 or communication device 16 of internal device 15 has been replaced, the CPU box 14 can automatically obtain the management data of the mounting machine module 12 corresponding to the internal device 15. With this, in a case where CPU box 14 or communication device 16 of internal device 15 has been replaced, much of the work for updating the management data of the mounting machine module 12 stored in the non-volatile storage medium of CPU box 14 can be automated.

Moreover, in the embodiment, each mounting machine module 12 is exchangeably placed on base 13, and based on the fact that communication device 16 communicating with CPU box 14 of each mounting machine module 12 provided for each mounting machine module 12 is configured on base 13, CPU box 14 of each mounting machine module 12 obtains the MAC address of communication device 17 of base 13 by communicating with communication device 17 of base 13, and compares the MAC address of communication device 17 of base 13 with the storage data of the MAC address of communication device 17 of base 13 read from the non-volatile storage medium of CPU box 14. If both do not match each other when compared, CPU box 14 determines that at least one of mounting machine module 12, CPU box 14, or communication device 17 of base 13 has been replaced, and obtains the management data of mounting machine module 12 stored in association with the MAC address of communication device 17 of base 13 from the non-volatile storage medium 22 of management computer 21. Thus, in a case where one of mounting machine module 12 on base 13, CPU box 14 of mounting machine module 12, and communication device 17 of base 13 has been replaced, CPU box 14 can automatically identify the replacement and can automatically obtain the management data of the mounting machine module 12 placed on base 13.

Furthermore, in the embodiment, when the loading of the boot-up image fails the operating system boots after the power is turned on, since the CPU box 14 of each mounting machine module 12 boots in safe mode, and reboots after obtaining the boot-up image of the operating system from management computer 21, the CPU box 14 of each mounting machine module 12 can automatically reboot even if CPU box 14 fails to boot.

In addition, in the embodiment, when the boot-up image is successfully loaded when the operating system boots after the power is turned on, the CPU box 14 of each mounting machine module 12 obtains information on the version of the operating system of management computer 21 from management computer 21. In a case where the version of the booted operating system does not coincide with the version of the operating system of management computer 21, the CPU box 14 reboots after obtaining the boot-up image of the operating system from management computer 21. Thus, in a case where the version of the booted operating system does not match the version of the operating system of management computer 21, CPU box 14 can reboot after automatically obtaining the boot-up image of the operating system from management computer 21, and can automatically make the version of the operating system used in CPU box 14 match the version of the operating system of management computer 21.

Note that, the present disclosure is not limited to the embodiment, and, instead of a MAC address, it is possible to use any identification information so long as the identification information can uniquely identify the communication entity. It goes without saying that various modifications can be made within a range that does not depart from the gist, such as the configuration of component mounting line 11 may be changed and the component mounting line may be configured from a component mounting machine that is not mounted on the base.

REFERENCE SIGNS LIST

11 . . . component mounting line, 12 . . . mounting machine module (device), 13 . . . base, 14 . . . CPU box, 15 . . . internal device, 16 . . . communication device of internal device, 17 . . . communication device of base, 21 . . . management computer, 22 . . . non-volatile storage medium

The invention claimed is:

1. A management system for a component mounting line in which multiple devices that perform multiple processes for producing an electronic component mounting board on which an electronic component is mounted in an order are disposed along a conveyance path of the electronic component mounting board, the system comprising:
a management computer that is connected to the multiple devices configuring the component mounting line through a communication network and manages the component mounting line,
wherein a CPU box as a control entity and an internal device communicating with the CPU box are attached to each device configuring the component mounting line,
unique identification information assigned to a communication device of the internal device communicating with the CPU box is stored in a non-volatile storage medium of the CPU box of each device, and
management data of each device is stored in the non-volatile storage medium of the management computer in association with the unique identification information of an internal device side of each device configuring the component mounting line, and
the CPU box of each device communicates with the communication device of the internal device, obtains the unique identification information of the internal device side, compares the unique identification information of the internal device side with the storage data of the unique identification information of the internal device side read from the non-volatile storage medium of the CPU box, and, if both do not match each other based on the comparing, determines that the CPU box or the communication device of the internal device has been replaced, and obtains the management data of the device stored in association with the unique identification information of the internal device side from the non-volatile storage medium of the management computer.

2. The management system for a component mounting line according to claim 1,
wherein the unique identification information assigned to the internal device is a MAC address that is physically assigned to uniquely identify each communication entity on the communication network.

3. The management system for a component mounting line according to claim 1,
wherein the management data of each device stored in the non-volatile storage medium of the management computer includes at least one of a serial number of each device, calibration data, function setting data, and a disposition order.

4. The management system for a component mounting line according to claim 1,
wherein when the management data of the device stored in association with the unique identification information of the internal device side is obtained from the non-volatile storage medium of the management computer, if the management data of the device associated with the unique identification information of the internal device side is not stored, the CPU box of each device prompts an operator to input the management data of the device, and stores the management data of the device input by the operator in the non-volatile storage medium of the management computer in association with the unique identification information of the internal device side.

5. The management system for a component mounting line according to claim 1,
wherein each of the devices is exchangeably placed on the base,
the communication device communicating with the CPU box of each device is provided for each device on the base,
the unique identification information assigned to the communication device of the base communicating with the CPU box is stored in the non-volatile storage medium of the CPU box of each device,
the management data of each device is stored in the non-volatile storage medium of the management computer in association with the unique identification information of the communication device of the base, and
the CPU box of each device communicates with the communication device of the base, obtains the unique identification information of the communication device of the base, compares the unique identification information of the communication device of the base with the storage data of the unique identification information of the communication device of the base read from the non-volatile storage medium of the CPU box, and, if both do not match each other based on the comparing, determines that at least one of the device, the CPU box, and the communication device of the base has been replaced, and obtains the management data of the device stored in association with the unique identification information of the communication device of the base from the non-volatile storage medium of the management computer.

6. The management system for a component mounting line according to claim 1,
wherein when loading of a boot-up image fails during booting of an operating system after power is turned on, the CPU box of each device boots in a safe mode, obtains the boot-up image of the operating system from the management computer, and then reboots.

7. The management system for a component mounting line according to claim 6,
wherein when the boot-up image is successfully loaded during booting of the operating system after power is turned on, the CPU box of each device obtains information of a version of the operating system of the management computer from the management computer, and when the version of the booted operating system does not coincide with the version of the operating system of the management computer, the CPU box obtains the boot-up image of the operating system from the management computer, and then reboots.

8. A management method for a component mounting line in which multiple devices that perform multiple processes for producing an electronic component mounting board on which an electronic component is mounted in an order are arranged along a conveyance path of the electronic component mounting board,
wherein a management computer that is connected to the multiple devices configuring the component mounting line through a communication network and manages the component mounting line is provided,
the method comprising:
attaching a CPU box as a control entity and an internal device communicating with the CPU box to each device configuring the component mounting line;
storing unique identification information assigned to a communication device of the internal device communicating with the CPU box in a non-volatile storage medium of the CPU box of each device;
storing the management data of each device in the non-volatile storage medium of the management computer in association with the unique identification information of an internal device side of each device configuring the component mounting line; and
obtaining the management data of the device stored in association with the unique identification information of the internal device side from the non-volatile storage medium of the management computer, based on that the CPU box of each device communicates with the communication device of the internal device, obtains the unique identification information of the internal device side, compares the unique identification information of the internal device side with the storage data of the unique identification information of the internal device side read from the non-volatile storage medium of the CPU box, and, if both do not match each other based on the comparing, determines that the CPU box or the communication device of the internal device has been replaced.

9. The management method for a component mounting line according to claim 8,
wherein each of the devices is exchangeably placed on the base,
the communication device communicating with the CPU box of each device is provided for each device on the base,
the unique identification information assigned to the communication device of the base communicating with the CPU box is stored in the non-volatile storage medium of the CPU box of each device,
the management data of each device is stored in the non-volatile storage medium of the management computer in association with the unique identification information of the communication device of the base, and
the CPU box of each device communicates with the communication device of the base, obtains the unique identification information of the communication device of the base, compares the unique identification information of the communication device of the base with the storage data of the unique identification information of the communication device of the base read from the non-volatile storage medium of the CPU box, and, if both do not match each other based on the comparing, determines that at least one of the device, the CPU box, and the communication device of the base has been replaced, and obtains the management data of the device stored in association with the unique identification information of the communication device of the base from the non-volatile storage medium of the management computer.

\* \* \* \* \*